US010545212B2

United States Patent
Curtis et al.

(10) Patent No.: US 10,545,212 B2
(45) Date of Patent: Jan. 28, 2020

(54) METHOD AND SYSTEM OF FREQUENCY CONSTRAINED GRADIENT WAVEFORM PRODUCTION

(71) Applicants: Andrew Thomas Curtis, Toronto (CA); Christopher Kumar Anand, Toronto (CA); Chad Tyler Harris, Toronto (CA); Jeff Alan Stainsby, Toronto (CA); Phil J. Beatty, Toronto (CA)

(72) Inventors: Andrew Thomas Curtis, Toronto (CA); Christopher Kumar Anand, Toronto (CA); Chad Tyler Harris, Toronto (CA); Jeff Alan Stainsby, Toronto (CA); Phil J. Beatty, Toronto (CA)

( * ) Notice: Subject to any disclaimer, the term of this patent is extended or adjusted under 35 U.S.C. 154(b) by 216 days.

(21) Appl. No.: 15/690,795

(22) Filed: Aug. 30, 2017

(65) Prior Publication Data
US 2019/0064301 A1 Feb. 28, 2019

(51) Int. Cl.
*G01R 33/389* (2006.01)
*G01R 33/565* (2006.01)

(52) U.S. Cl.
CPC ..... *G01R 33/56509* (2013.01); *G01R 33/389* (2013.01)

(58) Field of Classification Search
CPC ........................ G01R 33/389; G01R 33/56509
See application file for complete search history.

(56) References Cited

U.S. PATENT DOCUMENTS

| 5,899,858 A * | 5/1999 | Muthupillai ..... G01R 33/56358 324/307 |
| 7,301,341 B2 * | 11/2007 | Hargreaves .......... G01R 33/561 324/307 |
| 2005/0077895 A1 * | 4/2005 | Hargreaves .......... G01R 33/561 324/307 |
| 2006/0061358 A1 * | 3/2006 | Hargreaves ........ G01R 33/4616 324/307 |
| 2011/0234227 A1 * | 9/2011 | Weiger Senften .......................... G01R 33/4824 324/309 |
| 2015/0212179 A1 * | 7/2015 | Overall ................ G01R 33/543 324/309 |
| 2015/0241536 A1 * | 8/2015 | Grodzki ............... G01R 33/385 324/309 |
| 2018/0120401 A1 * | 5/2018 | Shin ................... G01R 33/4826 |
| 2019/0033410 A1 * | 1/2019 | Ennis ............... G01R 33/56341 |

OTHER PUBLICATIONS

Marcel et. al. "Shaping and Timing Gradient Pulsess to Reduce MRI Acoustic Noise" By Margnetic Resonance Medicine 64:546-553 2010.*

* cited by examiner

*Primary Examiner* — Dixomara Vargas
(74) *Attorney, Agent, or Firm* — Ridout & Maybee LLP

(57) ABSTRACT

The present disclosure provides a method and system of magnetic resonance imaging using a constrained gradient waveform. The constrained gradient waveform is designed to have only predetermined frequencies, for example excluding one or more identified resonant frequencies associated with the MRI system. The application of such a constrained gradient waveform during imaging may aid in reducing noise, vibration and/or heating of the MRI system during imaging.

20 Claims, 7 Drawing Sheets

METHOD AND SYSTEM OF FREQUENCY CONSTRAINED GRADIENT WAVEFORM PRODUCTION

FIELD

The present disclosure relates generally to magnetic resonance (MR) imaging and more specifically, to designing and producing gradient waveforms for application during MR imaging.

BACKGROUND

During MR imaging (MRI), a uniform magnetic field is applied to an imaging region in which a subject is disposed. A set of gradient coils modulate this main magnetic field so as to provide spatially localized information, enabling the subsequent spatial encoding of signals. Radiofrequency coils generate and apply one or more radio frequency pulses to the subject in the imaging regions in order to alter the atom's magnetization, the energy which is subsequently spatially encoded and re-emitted in a manner which is characteristic of the nuclear magnetic resonance properties of the tissue of interest.

Each MRI scan is driven by a pulse sequence, i.e. a sequence of precisely timed events, including the generation of particular gradient field(s) and radiofrequency pulse(s), which coordinate and control the various system components and result in the generation of the above-noted signal and acquisition of data. These controls include the flow of current in the gradient coils and radiofrequency coils. Such gradient control signals are typically termed "gradient waveforms".

Typically, gradient waveform design methodologies respect various MRI system constraints, such as maximum available gradient strength, duty cycles, nerve stimulation thresholds, and rise times (or gradient slew rates) per gradient axis. Gradient waveforms are often designed to serve a specific purpose when applied during MR imaging: to support slice selection, to encode k-space, or to spoil residual magnetization etc.

Driving of the gradient coils via these control waveforms usually creates various side effects that can negatively affect the image quality and/or MRI system stability. First, gradient waveforms that contain high frequency content can become distorted, since the gradient system (i.e. the amplifier and the coils) are inherently band limited (or low-pass) in nature. This distortion can lead to image artifacts. Secondly, changing the current in the gradient coils results in forces and torques on the gradient windings and the gradient coil, leading to vibration and noise.

This, and other similar vibrations, may reduce image quality, or lead to mechanical failures in extreme/repeated cases. Such vibrations also typically produce acoustic noise, like the "knocking" sound, which directly impacts on patient comfort. Since mechanical and acoustic resonances exist in any MRI system, certain driving frequencies tend to result in greater vibrations and/or acoustic noise than others during imaging.

In addition to noise and vibration, any coupling between the gradient coils and the magnet primary windings can lead to heating of the superconducting structures, which can also exhibit sharp frequency resonance behaviors. As noted before, such distortion can lead to image artifacts.

Such resonance "errors" during imaging may be reduced by better waveform design and production.

SUMMARY

According to an example aspect, the present disclosure provides a MRI system configured to perform pulse sequences to acquire imaging data. The MRI system includes a processor configured to initiate production of a constrained gradient waveform, wherein the constrained gradient waveform only contains predetermined frequencies. The MRI system also includes a pulse generator coupled to the processor for producing the constrained gradient waveform for use in image acquisition.

According to another example aspect, the present disclosure provides a method of performing pulse sequences during magnetic resonance imaging to acquire imaging data. The method includes initiating a constrained gradient waveform, wherein the constrained gradient waveform only contains predetermined frequencies. The method also includes applying the constrained gradient waveform during imaging.

BRIEF DESCRIPTION OF THE DRAWINGS

Example embodiments of the present disclosure are provided in the following description. Such description makes reference to the annexed drawings wherein.

DESCRIPTION OF EXAMPLE EMBODIMENTS

Traditional magnetic resonance imaging (MRI) systems represent an imaging modality which is primarily used to construct pictures of magnetic resonance (MR) signals from protons such as hydrogen atoms in an object. In medical MRI, typical signals of interest are MR signals from water and fat, the major hydrogen containing components of tissues.

Figure 1:
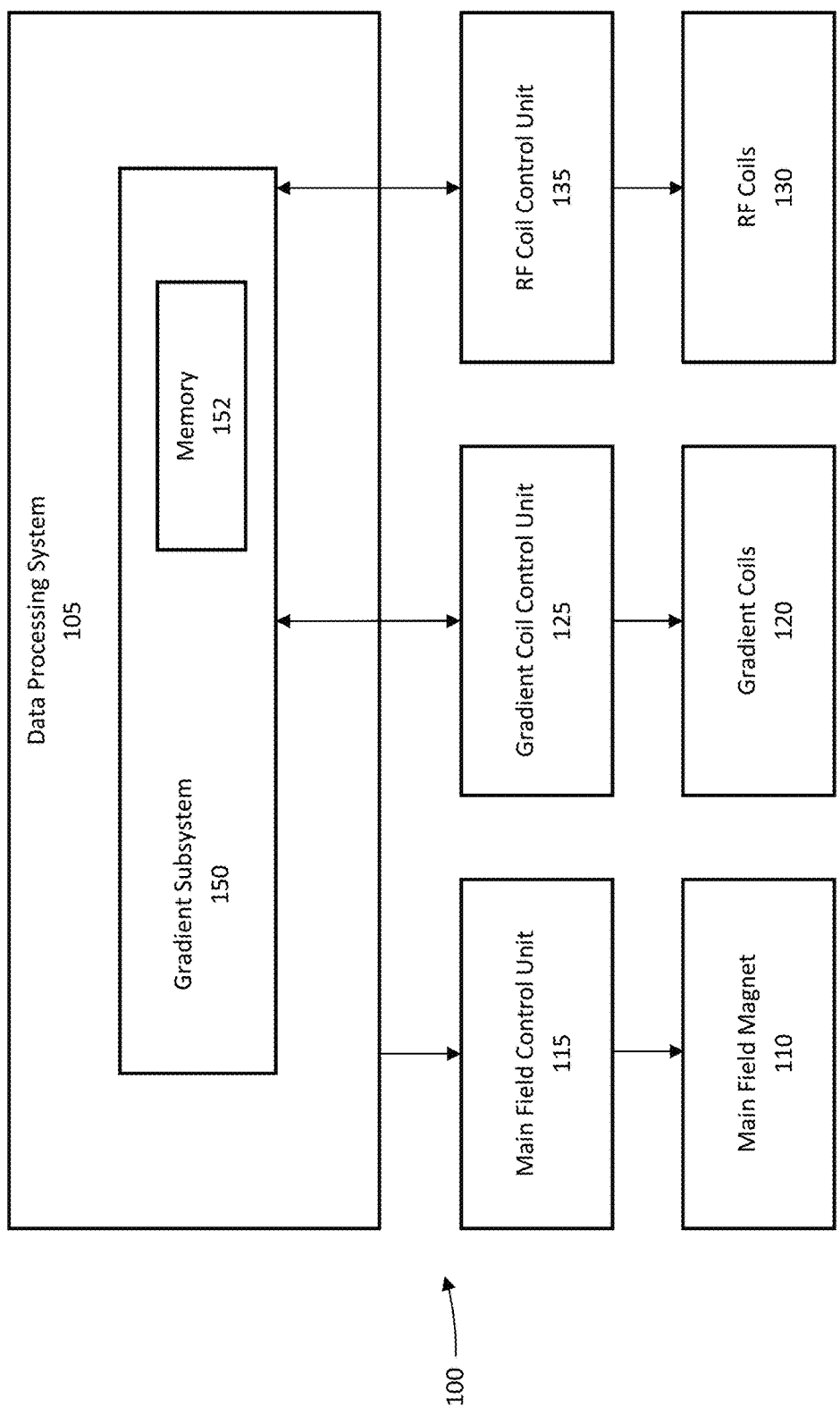
FIG. 1 is a block diagram of a magnetic resonance imaging (MRI) system, in accordance with an example embodiment.

Referring to FIG. 1, a block diagram of a magnetic resonance imaging (MRI) system, in accordance with an example implementation, is shown at 100. The example implementation of MRI system indicated at 100 is for illustrative purposes only, and variations including additional, fewer and/or varied components are possible.

As shown in FIG. 1, the illustrative MRI system 100 comprises a data processing system 105. The data processing system 105 can generally include one or more output devices such as a display, one or more input devices such as a keyboard and a mouse as well as one or more processors connected to a memory having volatile and persistent components. The data processing system 105 may further comprise one or more interfaces adapted for communication and data exchange with the hardware components of MRI system 100 used for performing a scan.

Continuing with FIG. 1, example MRI system 100 also includes a main field magnet 110. The main field magnet 110 may be implemented as a permanent, superconducting or a resistive magnet, for example. Other magnet types, including hybrid magnets suitable for use in MRI system 100 are contemplated. Main field magnet 110 is operable to produce a substantially uniform main magnetic field having strength B0 and a direction along an axis. The main magnetic field is used to create an imaging volume within which desired atomic nuclei, such as the protons in hydrogen within water and fat, of an object are magnetically aligned in preparation for a scan. In some implementations, as in this example implementation, a main field control unit 115 in communication with data processing system 105 may be used for controlling the operation of main field magnet 110.

MRI system 100 further includes gradient coils 120 used for encoding spatial information in the main magnetic field along, for example, three perpendicular gradient axes. The size and configuration of the gradient coils 120 may be such that they produce a controlled and uniform linear gradient. For example, three paired orthogonal current-carrying primary coils located within the main field magnet 110 may be designed to produce desired linear-gradient magnetic fields. Gradient coils 120 may include at least one asymmetric gradient coil 122.

In some implementations, gradient coils 120 may be shielded and include an outer layer of shield coils which can produce a counter magnetic field to counter the gradient magnetic field produced by the primary gradient coils forming a primary-shield coils pair. In such a coil pair the "primary" coils can be responsible for creating the gradient field and the "shield" coils can be responsible for reducing the stray field of the primary coil outside a certain volume such as an imaging volume. The primary and shield coils of the gradient coils 120 may be connected in series.

It is also possible to have more than two layers of coils for any given gradient axis that together form a shielded gradient coil. Shielded gradient coils 120 may reduce eddy currents and other interference which can cause artifacts in the scanned images. Since eddy currents mainly flow in conducting components of the MRI system 100 that are caused by magnetic fields outside of the imaging volume (fringe fields), reducing the fringe fields produced by gradient coils 120 may reduce interference. Accordingly, the shapes and sizes, conductor wire patterns and sizes, and current amplitudes and patterns of the primary-shield coils pair can be selected so that the net magnetic field outside the gradient coils 120 is as close to zero as possible. For cylindrical magnets, for example, the two coils may be arranged in the form of concentric cylinders whereas for vertical field magnets, the two coils may be arranged in coaxial disks.

The conductive components of the gradient coils 120, whether shielded or unshielded and including the primary and shield coils, may include an electrical conductor (for example copper, aluminum, etc.). The internal electrical connections can be such that when a voltage difference is applied to the terminals of the gradient coils 120, electric current can flow in the desired path. The conductive components for the three gradient axes for both the primary gradient coils and the gradient shield coils may be insulated by physical separation and/or a non-conductive barrier.

The magnetic fields produced by the gradient coils 120, in combination and/or sequentially, can be superimposed on the main magnetic field such that selective spatial excitation of objects within the imaging volume occurs. In addition to allowing spatial excitation, the gradient coils 120 may attach spatially specific frequency and phase information to the atomic nuclei placed within the imaging volume, allowing the resultant MR signal to be reconstructed into a useful image. A gradient coil control unit 125 in communication with data processing system 105 is used to control the operation of gradient coils 120.

In some implementations of MRI system 100, there may be additional electromagnet coils present (not shown), such as shim coils (traditionally, but not limited to, producing magnetic field profiles of 2nd order or higher spherical harmonics) or a uniform field offset coil or any other corrective electromagnet. To perform active shimming (correcting the field distortions that are introduced when different objects are placed within or around the system), the corrective electromagnets, such as the shim coils, carry a current that is used to provide magnetic fields that act to make the main magnetic field more uniform. For example, the fields produced by these coils may aid in the correction of inhomogeneities in the main magnetic field due to imperfections in the main magnet 110, the presence of external ferromagnetic objects, or susceptibility differences of materials within the imaging region, or due to any other static or time-varying phenomena.

The MRI system 100 further includes radio frequency (RF) coils 130. The RF coils 130 are used to establish an RF magnetic field with strength B1 to excite the atomic nuclei or "spins". The RF coils 130 can also detect signals emitted from the "relaxing" spins within the object being imaged. Accordingly, the RF coils 130 may be in the form of separate transmit and receive coils or a combined transmit and receive coil with a switching mechanism for switching between transmit and receive modes.

The RF coils 130 may be implemented as surface coils, which are typically receive only coils and/or volume coils which can be receive and transmit coils. RF coils 130 can be integrated in the main field magnet 110 bore. Alternatively, RF coils 130 may be implemented in closer proximity to the object to be scanned, such as a head, and can take a shape that approximates the shape of the object, such as a close-fitting helmet. An RF coil control unit 135 in communication with data processing system 105 may be used to control the operation of the RF coils 130 in either a transmit aspect or a receive aspect.

As noted above, gradient waveform design methodologies typically respect various MRI system constraints. To add an additional constraint on the frequency content of gradient waveforms, in some examples disclosed herein, data processing system 105 may be configured to limit the maximum bandwidth (e.g. with an upper bound or low pass constraint), and/or may add one or more band stop criteria to gradient waveforms.

As shown in FIG. 1, data processing system 105 further includes a gradient subsystem 150, which is configured to initiate or produce a constrained gradient waveform that only contains predetermined frequencies. Gradient subsystem 150 is configured to initiate the constrained gradient waveform by retrieving the constrained gradient waveform from a memory 152, or by designing the constrained gradient waveform as described below.

In the present embodiment, gradient subsystem 150 is configured to identify one or more particular frequencies of the gradient waveform which would increase acoustic noise, vibration and/or heating within MRI system 100 if that particular frequency in a gradient waveform were applied during an MR imagining sequence. Such a frequency would be identified as a "resonant frequency". One or more resonant frequencies of MRI system 100 may be inputted into gradient subsystem 150 as a parameter (e.g., by the user) for subsequent computation and application.

Having identified the one or more resonant frequencies, gradient subsystem 150 then "zeroes" or mathematically removes them from the gradient waveform during the waveform design/optimization process.

The frequencies at, and optionally around, an identified frequency that are "zeroed" provides a "band stop" constraint on the gradient waveform. Gradient subsystem 150 may "band stop" the gradient waveform around multiple resonant frequencies. In some examples, gradient subsystem 130 may perform such band-stopping for only a subset of the identified resonant frequencies.

Gradient subsystem 150 may also be configured to further limit the frequency content of the gradient waveform with an upper bound. As noted above, gradient waveforms that contain high frequency content can become distorted, since gradient systems (i.e. the amplifier and the coils) are inherently band limited (or low-pass) in nature. This distortion can lead to image artifacts. To limit the frequency content of the gradient waveform from higher frequencies, the gradient subsystem 150 identifies frequencies of the gradient waveform that are outside a predetermined threshold, referred to herein as the upper bound. This limits the maximum bandwidth of the gradient waveform, or "band limits" the frequencies outside the predetermined threshold.

The resulting gradient waveform, in which one or more resonant frequencies have been removed and/or which has been "band stopped" and/or "band limited", as described above, is a constrained gradient waveform, one which contains only predetermined frequencies.

Constrained in this manner, the frequency content of an exemplary constrained gradient waveform may comprise a sparse set of frequencies.

In some examples, a set of design criteria, or other constraints may be applied during the optimization process, to further constrain the gradient waveform. Such constraints may include, but are not limited to: maximum gradient amplitudes, slew rates, target areas, flatness, RMS duty cycles, frequency envelope, and gradient moments. Any suitable approach may be used to satisfy these other constraints.

In some examples, gradient subsystem 150 may be configured to minimize the number of non-zero coefficients in the modified Fourier series while also meeting one or more of the above-noted design goals.

In certain applications, gradient subsystem 150 may initiate a gradient waveform exhibiting periodicity. Many MRI sequences employ periodically repeating sets (or trains) of gradient waveforms, which may be referred to as periodic waveforms or periodic gradient waveforms for simplicity. Common examples of periodic waveforms in the MRI space include, but are not limited to, EPI readout trains, readout and slice gradients in multiple-Fast Spin Echo sequences, and the non-phase-encode related gradients in steady state sequences.

These periodic waveforms can be very long (hundreds of milliseconds), and direct (dense) numerical optimization can be intractable due to the resultant problem sizes. In this case, the periodic nature can be exploited to simplify the optimization process, allowing design of smooth trains with tailored frequency responses.

Gradient subsystem 150 may not necessarily be a separate component of data processing system 105, in that the general processor of data processing system 105 may perform the above-noted steps in conjunction with the general memory of data processing system 105. As well, memory 152 may not necessarily be separate from the general memory of data processing system 105. Use of gradient subsystem 150 will be discussed in further detail below.

To obtain images from the MRI system 100, one or more sets of RF pulses and the above-described constrained gradient waveform(s) (collectively called "pulse sequences") are selected by data processing system 105. The data processing system 105 communicates the selected pulse sequence information to the RF control unit 135 and the gradient control unit 125, which collectively generate the associated waveforms and timings for providing a sequence of pulses to perform a scan. Application of the above identified constrained gradient waveform may aid in avoiding resonances, and/or may aid in reducing noise, vibration, and/or heating in the MRI system 100 while obtaining images from the MRI system 100, and/or may aid in reducing image artifacts.

Figure 2:
FIG. 2 is a flow chart showing a method of magnetic resonance imaging using a constrained waveform in accordance with an example embodiment.
Figure 3:
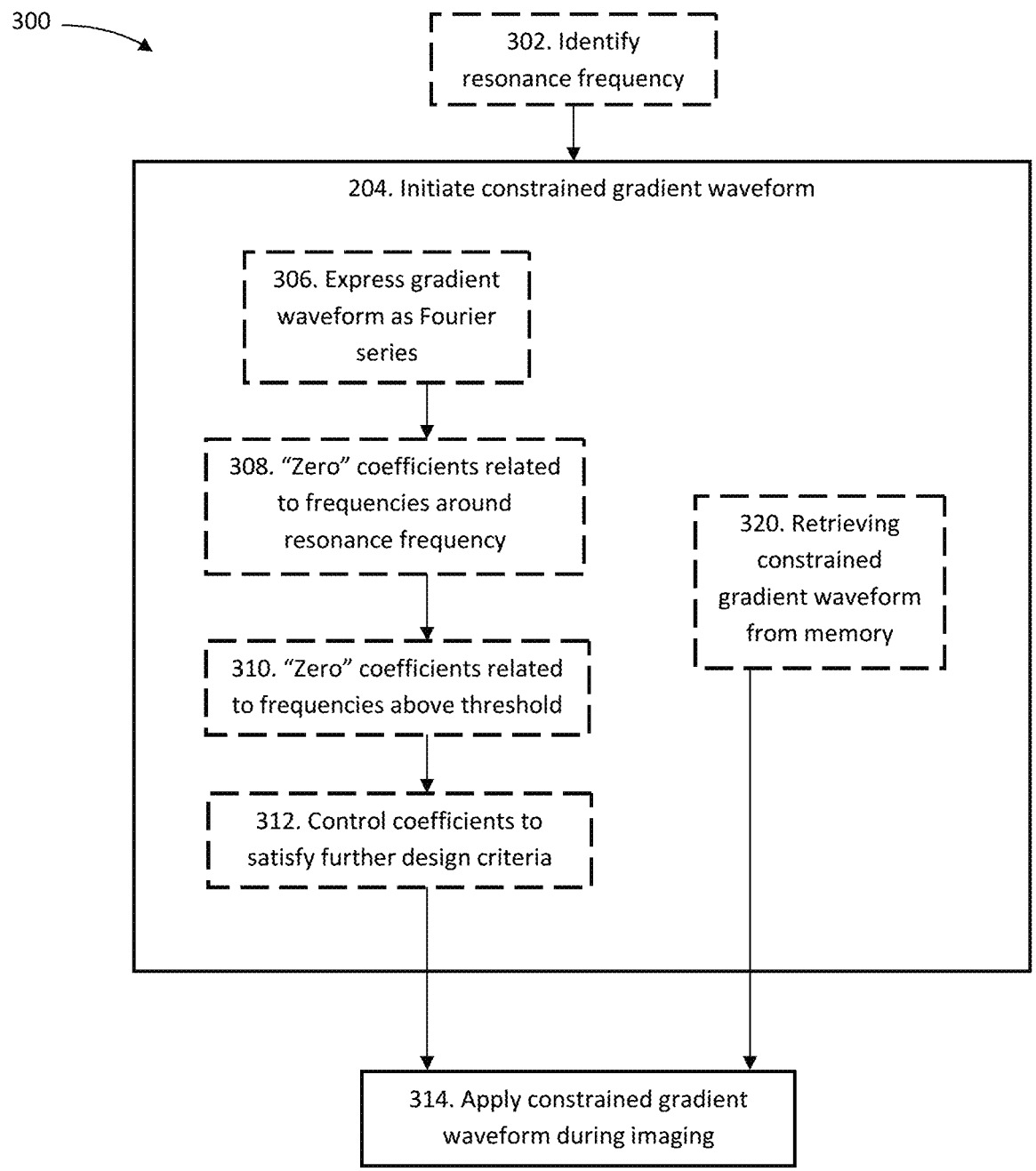
FIG. 3 is a flow chart showing a method of magnetic resonance imaging using a constrained waveform in accordance with another example embodiment.

Referring to FIGS. 2 and 3, exemplary methods of magnetic resonance imaging using a constrained gradient waveform are indicated generally at 200 and 300. The exemplary methods describe two approaches to initiating and designing the constrained gradient waveforms by solving mathematical optimization problems. These constrained gradient waveforms are the time-domain control signals sent to the amplifiers in order to create time-varying gradient fields in the imaging region.

In some examples, method 200 and method 300 may be at least in part operated using the MRI system 100 as shown in FIG. 1. Additionally, the following discussion of methods 200 and 300 lead to further understanding of system 100. However, it is to be understood that system 100, and methods 200 and 300 can be varied, and need not work exactly as discussed herein in conjunction with each other, and that such variations are within the scope of the appended claims.

The method of performing magnetic resonance imaging using a constrained gradient waveform, aperiodic in nature, 200 is shown in FIG. 2 where one or more resonant frequencies of the MRI system may optionally first be identified at 202. In some examples, identification of resonant frequencies may take place prior to the method 200 and provided as an input to the MRI system. The identified resonant frequencies are those frequencies which cause resonance in the MRI system and increase at least one of noise, vibration and heating within the MRI system. The identified resonant frequencies are specific to the MRI system, as the combination of the various system components, including the gradient coils, RF coils, gradient amplifiers etc., may resonate at different frequencies depending on their mechanical make-up.

The resonant frequency may be identified by a processor of the MRI system or be a parameter inputted (e.g., by an operator or received from an external system).

Having identified the one or more resonant frequencies, a constrained gradient waveform is then initiated at 204. Initiation of the constrained gradient waveform may include retrieving the constrained gradient waveform from memory at 220. Alternatively, initiation of the constrained gradient waveform may include expressing a gradient waveform as a Fourier Transform function at 206 and minimizing the frequency content related to frequencies around the identified resonance frequency at 208.

Optionally, the frequency content related to frequencies outside a predetermined threshold may also be minimized at 210, while the waveform may be further optimized to satisfy further design criteria at 212. An example embodiment is described below.

In gradient optimization, there are constraints imposed by the amplifier/gradient system: there is a maximum current and a maximum voltage, which directly relate to the maximum gradient strength and maximum gradient rate of change (slew rate).

Given the centrality of the current and voltage constraints, or, in terms of the waveform, constraints on the height and slope, the waveform may be divided into equal intervals of time and the height at the start of each interval may be treated as a variable. Call the heights $h_i$, for each sample time i, and let N be the number of samples. The constraints on height and speed may then be expressed as $|h_i| \le h_{peak}$ and $|h_i - h_{i+1}| \le h_{slew}$, respectively. In some cases, further constraints may be applied, such as requiring positive samples, $|h_i| \le 0$, monotonicity, or others. Another constraint may be that the waveform has a desired area over all or some subset of samples. This corresponds to a sum, where A is the desired area:

$$\sum_i h_i = A$$

To constrain the frequency composition of the waveform, the frequencies are calculated from the time samples, by using the appropriate Fourier Transform:

$$\tilde{h}(F) = \sum_i (h_i \cos f \cdot i)$$

In this example, the waveform is assumed to be symmetric, otherwise both sine and cosine terms would be required. To constrain the frequency content of the waveform, $\tilde{h}(f)$ needs to be constrained to zero for all frequency f outside a predetermined frequency range or threshold. In some applications, the predetermined threshold may be +/−10 kHz or up to +/−40 kHz.

Constraining the frequency content of the waveform to be zero for all f outside the predetermined frequency range is not usually possible. Instead, the waveform which comes as close to meeting this criteria as possible, by having the smallest such values $\tilde{h}(f)$ among all waveforms h, is selected.

Rather than considering an infinite number of frequencies, a suitably dense set of sample frequencies is selected at which to minimize frequency content. Let F be the set of these frequencies, and let s be their maximum in absolute value.

The resulting problem is:

$$\begin{aligned}
\text{Min } & s \\
\text{Subject to } & |\tilde{h}(f)| < s && \text{for all } f \in F \\
& \tilde{h}(f) = \sum_i (h_i \cos f \cdot i) && \text{for all } f \in F \\
& |h_i| \le h_{peak} && \text{for all } 0 < i \le N \\
& |h_i \ h_{i+1}| \le h_{slew} && \text{for all } 0 < i < N \\
& \sum_{0 < i \le N} h_i = A
\end{aligned}$$

The set F can be chosen, not only to satisfy the amplifier limitations, but also to avoid known problematic frequencies. The larger the set F, the better the adherence to the constraints on frequency content tends to be. The resulting time domain waveform solution h, forms the constrained gradient waveform to be applied during imaging. Solving this optimization problem may be computationally expensive, and a larger set of F also tends to result in a larger optimization problem, and, potentially, a slower solution. Another example implementation will now be discussed, which may be computationally more efficient.

A method of performing magnetic resonance imaging using a constrained gradient waveform, periodic in nature, 300 is shown in FIG. 3. Many gradient waveforms are used repeatedly, to collect data in a sequence. The resulting waveform is periodic. In such cases, an approach may be used to reduce the problem's complexity.

In a similar manner as described above, one or more resonant frequencies of the MRI system may optionally first be identified at 302.

Having identified the one or more resonant frequencies, a constrained gradient waveform is then designed or initiated at 304. Initiation of the constrained gradient waveform may include retrieving the constrained gradient waveform from memory at 320. Alternatively, initiation of the constrained gradient waveform may include expressing a gradient waveform as a discrete Fourier series at 306. Breaking a periodic waveform down into frequency components typically results in only frequencies which are a multiple of the fundamental frequency for that period. This is called a Fourier Series.

A zero constraint may then be added to the closest N coefficients in the Fourier series which correspond to frequencies at and/or around the identified resonant frequencies at 308. This constraint, of zeroing of the identified coefficients about the resonant frequency, when added to an optimization problem, effectively nulls the resonant frequency from the waveform. This may be referred to as "band stopping" the gradient waveform.

As a further constraint, method 300 may optionally comprise limiting the frequency content of the gradient waveform with an upper bound by identifying those frequencies of the gradient waveform that are outside the predetermined threshold (i.e. the upper bound), for example, by zeroing their corresponding coefficients in the discrete Fourier series at 310. As before, when this constraint, of limiting frequencies within the pass band of the amplifier, is added to an optimization problem, this effectively results in the removal of the frequencies outside the predetermined threshold. This limits the maximum bandwidth of the gradient waveform or may be referred to as "band limiting" the constrained gradient waveform.

The constrained gradient waveform may be further optimized by controlling the coefficients of the discrete Fourier series to satisfy a set of further design criteria at 312, including but not limited to: maximum gradient amplitudes, slew rates, target areas, flatness, RMS duty cycles, frequency envelope, and gradient moments.

For further optimization, the number of non-zero coefficients in the modified Fourier series may be minimized.

An example embodiment will now be described. Adding the constraint that only frequencies within the passband of the amplifier be used results in a finite set of possible frequencies (and thus automatic band limiting of the waveforms). Let those frequencies be $f \in F$, and the amplitude of those frequencies be $\hat{h}_f$. In some applications, the waveforms may be band limited to $+/-10$ kHz or up to $+/-40$ kHz.

In the case of a symmetrical waveform, the amplitudes are real numbers, otherwise they may be complex. In many common cases, the waveform must start and end at zero. In such cases, the value of the waveform at time t is $$h(f) - \sum_{f \in F} \sin(2\pi t f) \hat{h}_f$$

Since this equation is differentiable, the slope constraint may be expressed as $|h'(t)| \leq h_{slew}$. However, the waveform cannot practically be tested at every possible time point.

In an MRI device, such as MRI system 100, the waveform is sampled, usually at a regular time step, which is a multiple of 1 μs. Accordingly, instead of using the physical constraint, the same discrete approximation of the constraint which is used in the scan control system may be used.

Similarly to method 200 discussed above, the area under the waveform may be constrained. However, assumptions commonly made in the time domain cannot be made, for instance, that the waveform will be constant within a time subinterval.

There are many reasons flat sections are desirable, including the fact that the data collected on a flat waveform can be processed using the Fast Fourier Transform, which is not only faster, but is more readily correctable, in case of experiment error. If a flat section is desirable, the solution may be made as flat as possible by using the deviation, δ, from a target amplitude, g, over a subset $S \in F$ of samples in the objective function which will be minimized. The resulting optimization problem becomes:

$$\begin{aligned}
\min \quad & \delta \\
\text{subject to} \quad & |h(i) - \mu| \leq \delta && \text{for all } i \in S \\
& h(t) - \sum_{f \in F} \sin(2\pi t f) \hat{h}_f && \text{for all } t \\
& |h(i)| \leq h_{peak} && \text{for all } 0 < i \leq N \\
& |h(i) - h(i+1)| \leq h_{slew} && \text{for all } 0 < i < N \\
& \sum_{0 < i \leq N} h(i) = A
\end{aligned}$$

The target amplitude, g, can also be constrained, if a particular value is desired. In order to achieve nulling of particular frequencies, we can weight or simply remove some subset of the $\hat{h}_f$ control variables. In the present embodiment, nulling of an undesired resonance is achieved by removing the nearest frequency component from the optimization variables.

An additional advantage for avoidance of undesired resonances is also derived from the sparse nature of the frequency controls themselves. Many undesired frequencies can be avoided by choosing waveform periodicities such that none of the $f \in F$ are close to the resonance to be avoided (assessed by the frequency and width of the problem resonance peak).

The resulting waveform solution h of this, mathematically simplified, optimization problem forms the constrained gradient waveform to be applied during imaging.

Figure 4B:
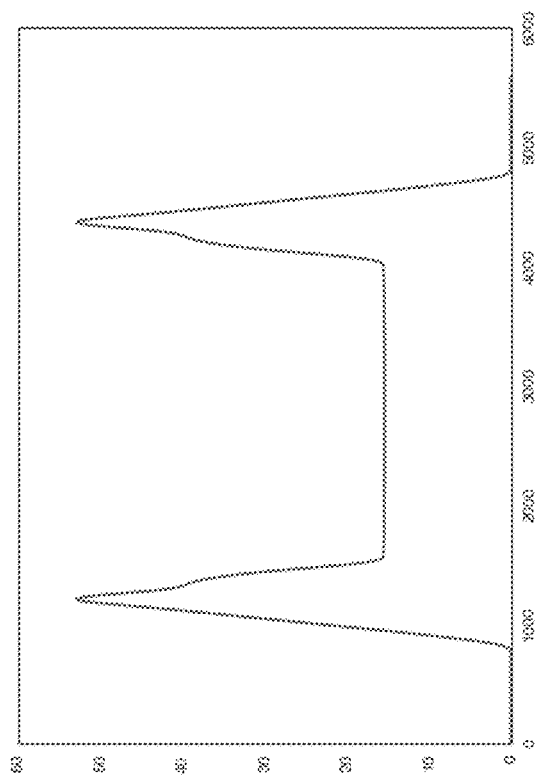
FIG. 4b shows an example gradient waveform designed according to the present disclosure.
Figure 4A:
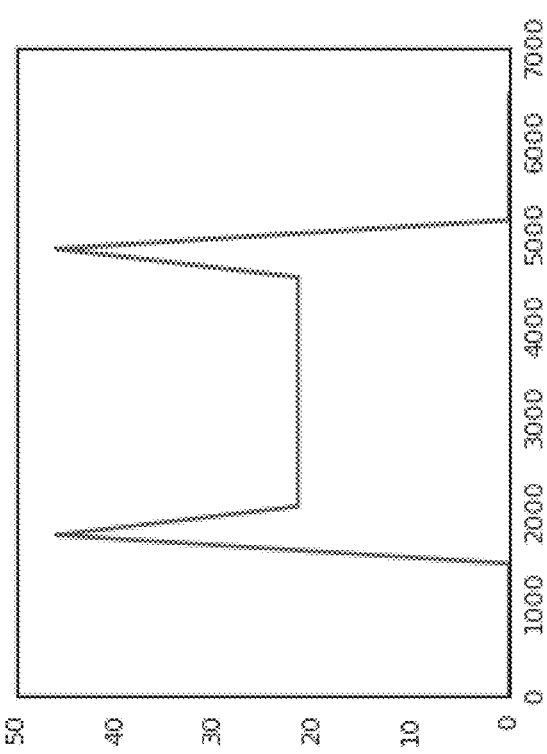
FIG. 4a shows an example waveform of a conventional gradient waveform.

Turning now to FIGS. 4a and 4b, an example is shown where the resonant frequency was identified and band stopped at 2800 Hz with a $+/-10$ kHz band limit. The resulting waveform is shown in FIG. 4b, wherein gradient strength (mT/m) is shown as a function of time (μs). In comparison, the waveform of the conventional gradient waveform is shown in FIG. 4a.

Figure 5A:
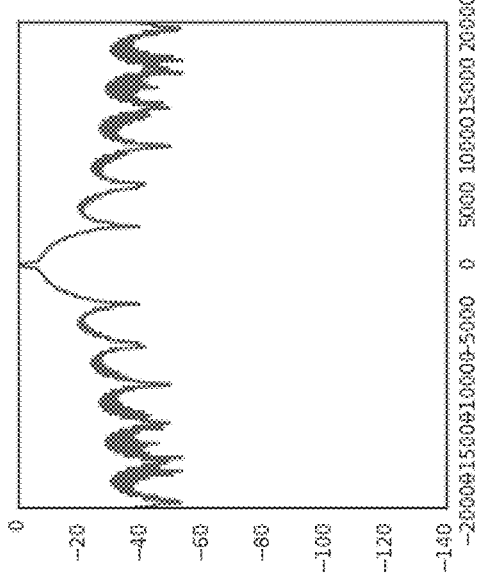
FIG. 5a shows a power spectrum demonstrating frequency response to the conventional gradient waveform of FIG. 4b.
Figure 5B:
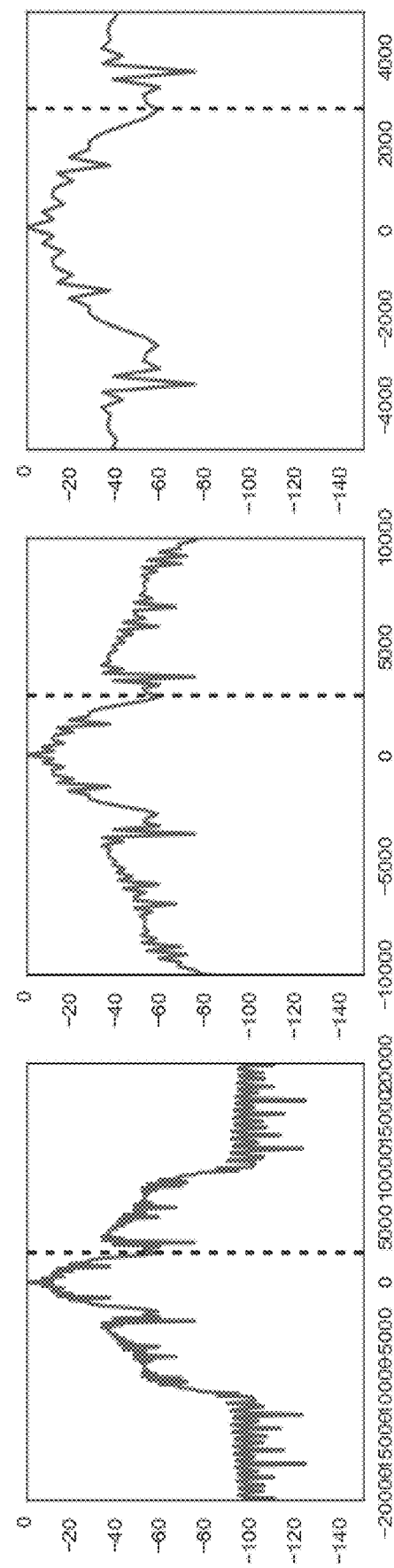
FIG. 5b shows power spectra demonstrating frequency response to the gradient waveform of FIG. 4b.

The differences are most notable in the power spectra shown in FIGS. 5a and 5b. The associated power spectra in FIG. 5b shows decibel (dB) to be a function of frequency (Hz). As noted in comparison to the power spectra of the conventional gradient waveform shown in FIG. 5a, application of the constrained gradient waveform results in a power spectrum that is different in extent (band limiting), and which exhibits a prominent band stop (see vertical dashed lines) at 2800 Hz.

The above noted steps in 200 and 300 may be performed during imaging or may alternatively be calculated in advance, and the constrained gradient waveform may be stored, and then applied during imaging. In either case, the constrained gradient waveform is then applied to a subject at 214 or 314 during medical resonance imaging.

By designing such a band stop and band limit in the frequency content of the constrained gradient waveform, noise, vibrations, and/or gradient-induced magnet heating may be reduced.

Figure 6:
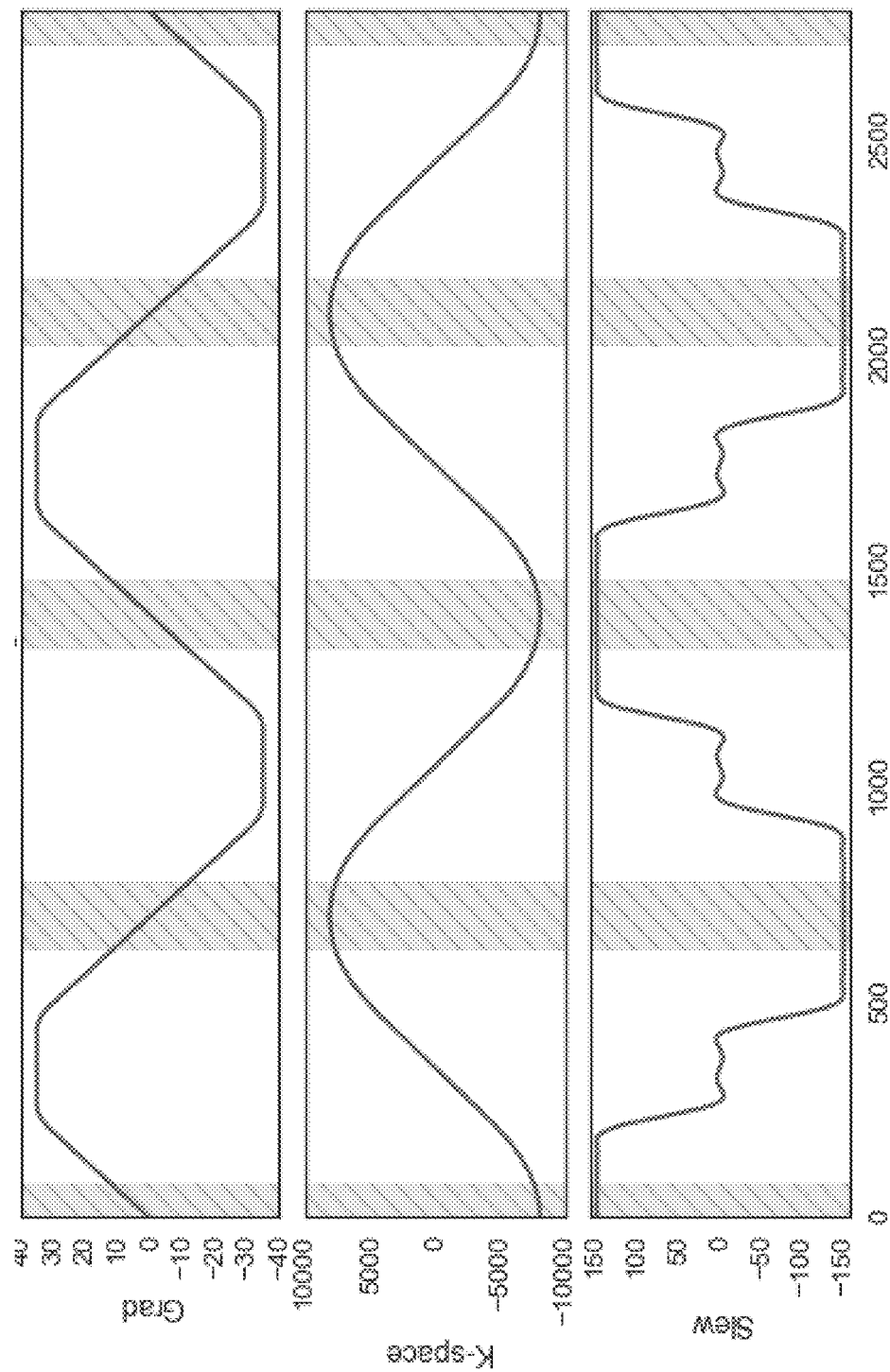
FIG. 6 shows an exemplary periodic gradient waveform initiated according to the present disclosure.

FIG. 6 shows an exemplary design of an EPI train, demonstrating two repetitions of an example constrained periodic waveform. The top graph shows the constrained gradient waveform, centre graph showing the k-space traversed, and the bottom graph shown the slew rate vs time.

Figure 7:
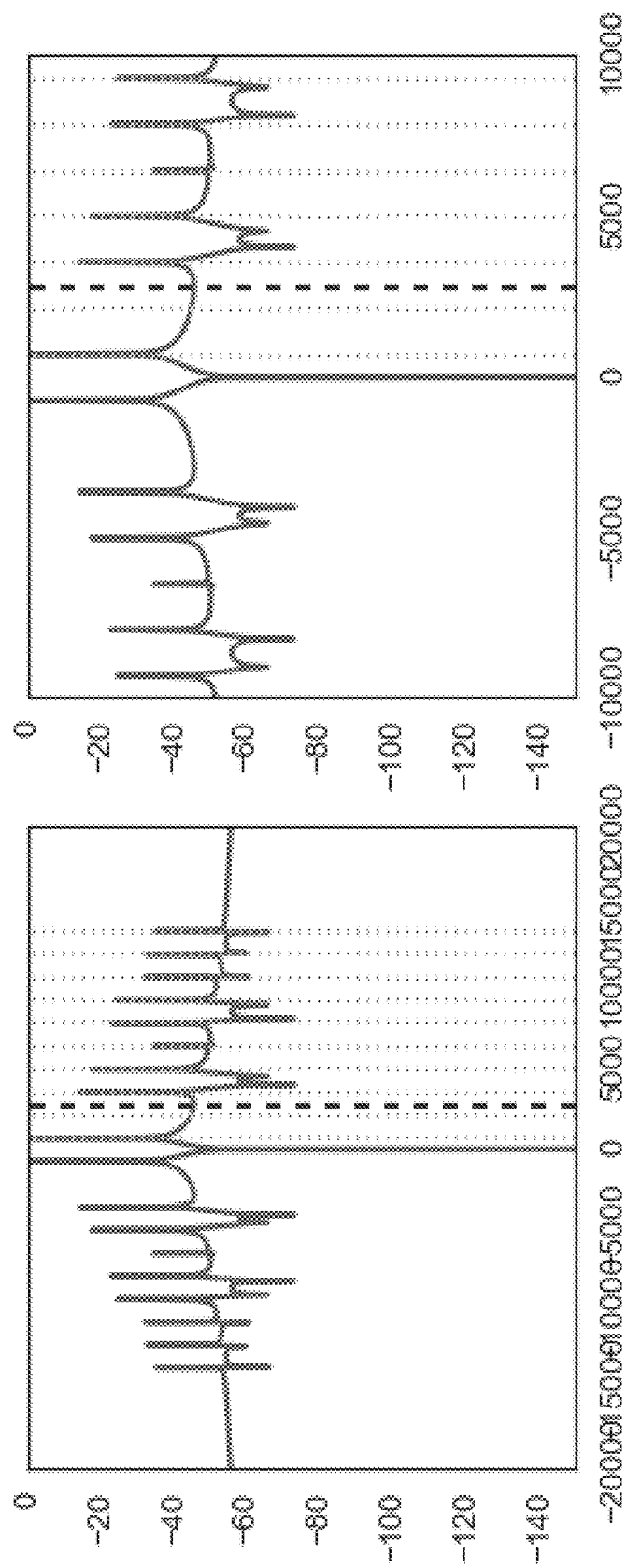
FIG. 7 shows power spectra demonstrating frequency response to the periodic gradient waveform of FIG. 6.

FIG. 7 shows power spectra in association with the gradient waveform shown in FIG. 6, where the solution coefficients (filter taps) are expressed as a power spectrum in frequency space. For a Fourier series, only certain frequencies can exist for a particular periodicity, and they are evenly spaced. As such, the dotted lines indicate control point loci and the dashed line indicates the possibility of creating band stop frequency behavior close to the control points. The limited number of controls is a direct result of capturing the structure of the problem space. As a result of this approach, optimization of much longer (duration) gradient waveforms is enabled.

While some embodiments or aspects of the present disclosure may be implemented in fully functioning computers and computer systems, other embodiments or aspects may be capable of being distributed as a computing product in a variety of forms and may be capable of being applied regardless of the particular type of machine or computer readable media used to actually effect the distribution.

At least some aspects disclosed may be embodied, at least in part, in software. That is, some disclosed techniques and methods may be carried out in a computer system or other data processing system in response to its processor, such as a microprocessor, executing sequences of instructions contained in a memory, such as ROM, volatile RAM, non-volatile memory, cache or a remote storage device.

A computer readable storage medium may be used to store software and data which when executed by a data processing system causes the system to perform various methods or techniques of the present disclosure. The executable software and data may be stored in various places including for example ROM, volatile RAM, non-volatile memory and/or cache. Portions of this software and/or data may be stored in any one of these storage devices.

Examples of computer-readable storage media may include, but are not limited to, recordable and non-recordable type media such as volatile and non-volatile memory devices, read only memory (ROM), random access memory (RAM), flash memory devices, floppy and other removable disks, magnetic disk storage media, optical storage media (e.g., compact discs (CDs), digital versatile disks (DVDs), etc.), among others. The instructions can be embodied in digital and analog communication links for electrical, optical, acoustical or other forms of propagated signals, such as carrier waves, infrared signals, digital signals, and the like. The storage medium may be the internet cloud, or a computer readable storage medium such as a disc.

Furthermore, at least some of the methods described herein may be capable of being distributed in a computer program product comprising a computer readable medium that bears computer usable instructions for execution by one or more processors, to perform aspects of the methods described. The medium may be provided in various forms such as, but not limited to, one or more diskettes, compact disks, tapes, chips, USB keys, external hard drives, wire-line transmissions, satellite transmissions, internet transmissions or downloads, magnetic and electronic storage media, digital and analog signals, and the like. The computer useable instructions may also be in various forms, including compiled and non-compiled code.

At least some of the elements of the systems described herein may be implemented by software, or a combination of software and hardware. Elements of the system that are implemented via software may be written in a high-level procedural language such as object oriented programming or a scripting language. Accordingly, the program code may be written in C, C++, J++, or any other suitable programming language and may comprise modules or classes, as is known to those skilled in object oriented programming. At least some of the elements of the system that are implemented via software may be written in assembly language, machine language or firmware as needed. In either case, the program code can be stored on storage media or on a computer readable medium that is readable by a general or special purpose programmable computing device having a processor, an operating system and the associated hardware and software that is necessary to implement the functionality of at least one of the embodiments described herein. The program code, when read by the computing device, configures the computing device to operate in a new, specific and predefined manner in order to perform at least one of the methods described herein.

While the teachings described herein are in conjunction with various embodiments for illustrative purposes, it is not intended that the teachings be limited to such embodiments. On the contrary, the teachings described and illustrated herein encompass various alternatives, modifications, and equivalents, without departing from the described embodiments, the general scope of which is defined in the appended claims. Except to the extent necessary or inherent in the processes themselves, no particular order to steps or stages of methods or processes described in this disclosure is intended or implied. In many cases the order of process steps may be varied without changing the purpose, effect, or import of the methods described.

The invention claimed is:

1. A magnetic resonance imaging (MRI) system configured to perform pulse sequences to acquire imaging data, the MRI system comprising:
    a processor configured to initiate production of a constrained gradient waveform, wherein frequency content around at least one resonant frequency is minimized, such that the constrained gradient waveform comprises multiple discrete frequency components;
    a pulse generator coupled to the processor for producing the constrained gradient waveform for use in image acquisition.

2. The system of claim 1, wherein the constrained gradient waveform is band stopped at the at least one resonant frequency.

3. The system of claim 2, wherein the processor is further configured to identify the at least one resonant frequency of the gradient waveform.

4. The system of claim 3, wherein the at least one resonant frequency is identified by the processor as a frequency that increases at least one of noise, vibration and heating within the MRI system.

5. The system of claim 4, wherein frequency content which represent frequencies outside a predetermined threshold are removed, such that the constrained gradient waveform is band limited to frequencies within the predetermined threshold.

6. The system of claim 5, wherein the gradient waveform is controlled to satisfy a set of design criteria to optimize the constrained gradient waveform.

7. A method of performing pulse sequences during magnetic resonance imaging to acquire imaging data, the method comprising:
    initiating a constrained gradient waveform, wherein frequency content around at least one resonant frequency is minimized, such that the constrained gradient waveform comprises multiple discrete; and
    applying the constrained gradient waveform during imaging.

8. The method of claim 7, wherein the constrained gradient waveform is aperiodic in nature and the initiating comprises:
    expressing a gradient waveform as a Fourier Transform function; and
    minimizing frequency content in the Fourier Transform around the at least one resonant frequency, resulting in the discrete frequency components and thereby band stopping the gradient waveform at the at least one resonant frequency.

9. The method of claim 8, wherein the at least one resonant frequency is a frequency that increases at least one of noise, vibration and heating during imaging.

10. The method of claim 8, further comprising identifying the at least one resonant frequency.

11. The method of claim 8, further comprising minimizing the frequency content for frequencies outside a predetermined threshold, thereby band limiting the waveform to frequencies within the predetermined threshold.

12. The method of claim 8, further comprising optimizing the constrained gradient waveform to satisfy a set of design criteria.

13. The method of claim 7, wherein the gradient waveform is periodic in nature, and the initiating comprises:
    expressing a gradient waveform as a discrete Fourier series; and zeroing coefficients in the discrete Fourier series related to frequencies at the at least one resonant frequency, resulting in the discrete frequency components and thereby band stopping the gradient waveform at the at least one resonant frequency.

14. The method of claim 13, wherein resonance caused by the at least one resonant frequency increases at least one of noise, vibration and heating during imaging.

15. The method of claim 13, further comprising identifying the at least one resonant frequency of the gradient waveform.

16. The method of claim 13, further comprising zeroing coefficients in the discrete Fourier series which represent frequencies which are outside a predetermined threshold, thereby band limiting the constrained gradient waveform to frequencies within the predetermined threshold.

17. The method of claim 13, further comprising optimizing the constrained gradient waveform by controlling the coefficients of the discrete Fourier series to satisfy a set of design criteria.

18. The method of claim 13, wherein the number of non-zero coefficients are minimized.

19. The system of claim 5, wherein the predetermined threshold is an upper bound of the frequency content.

20. The method of claim 11, wherein the predetermined threshold is an upper bound of the frequency content.

* * * * *

UNITED STATES PATENT AND TRADEMARK OFFICE
CERTIFICATE OF CORRECTION

PATENT NO. : 10,545,212 B2
APPLICATION NO. : 15/690795
DATED : January 28, 2020
INVENTOR(S) : Andrew Thomas Curtis et al.

Page 1 of 1

It is certified that error appears in the above-identified patent and that said Letters Patent is hereby corrected as shown below:

In the Claims

Column 12, Line 39 delete "form comprises multiple discrete; and" and insert --form comprises multiple discrete frequency components; and--

Signed and Sealed this
Sixteenth Day of June, 2020

Andrei Iancu
*Director of the United States Patent and Trademark Office*